United States Patent
Gordon et al.

(10) Patent No.: US 7,184,026 B2
(45) Date of Patent: *Feb. 27, 2007

(54) IMPEDANCE SENSING SCREEN POINTING DEVICE

(75) Inventors: Gary B. Gordon, Saratoga, CA (US); Hugh Wallace, Ft. Collins, CO (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 446 days.

This patent is subject to a terminal disclaimer.

(21) Appl. No.: 09/812,252

(22) Filed: Mar. 19, 2001

(65) Prior Publication Data

US 2002/0130273 A1    Sep. 19, 2002

(51) Int. Cl.
    *G09G 5/00* (2006.01)
(52) U.S. Cl. .................................. 345/173; 178/18.01
(58) Field of Classification Search ........ 345/156–159, 345/173, 174, 176, 98, 92, 80, 177; 257/347, 257/318; 438/239, 414, 329, 365, 356, 242; 349/42, 44; 178/18.03, 18.02, 18.04, 19.01, 178/19.03, 18.01; 250/491.1
    See application file for complete search history.

(56) References Cited

U.S. PATENT DOCUMENTS

| | | | | |
|---|---|---|---|---|
| 5,194,862 A * | 3/1993 | Edwards | ...................... | 341/20 |
| 5,376,947 A * | 12/1994 | Kuroda | ...................... | 345/173 |
| 5,424,756 A * | 6/1995 | Ho et al. | .................... | 345/158 |
| 5,578,813 A | 11/1996 | Allen et al. | .............. | 250/208.1 |
| 5,579,032 A * | 11/1996 | Busch | ......................... | 345/157 |
| 5,644,139 A | 7/1997 | Allen et al. | ................. | 250/557 |
| 5,786,804 A | 7/1998 | Gordon | ...................... | 345/158 |
| 5,880,411 A * | 3/1999 | Gillespie et al. | ......... | 178/18.01 |
| 5,892,499 A * | 4/1999 | Vulk, Jr. | ..................... | 345/156 |
| 5,994,710 A | 11/1999 | Knee et al. | .................. | 250/557 |
| 6,029,214 A * | 2/2000 | Dorfman et al. | ............. | 710/73 |
| 6,057,540 A * | 5/2000 | Gordon et al. | .............. | 250/221 |
| 6,067,113 A * | 5/2000 | Hurwitz et al. | ............. | 348/241 |
| 6,134,340 A * | 10/2000 | Hsu et al. | .................... | 382/124 |
| 6,151,015 A | 11/2000 | Badyal et al. | .............. | 345/179 |
| 6,163,313 A * | 12/2000 | Aroyan et al. | .............. | 345/173 |
| 6,256,022 B1 * | 7/2001 | Manaresi et al. | ........... | 345/174 |
| 6,369,737 B1 * | 4/2002 | Yang et al. | .................. | 341/155 |
| 6,392,636 B1 * | 5/2002 | Ferrari et al. | ............... | 345/173 |
| 6,621,483 B2 * | 9/2003 | Wallace et al. | ............. | 345/157 |

OTHER PUBLICATIONS

"Seeing Eye" Mouse for a Computer System, U.S. Appl. No. 09/052,046, filed Mar. 30, 1998.

* cited by examiner

*Primary Examiner*—Richard Hjerpe
*Assistant Examiner*—Abbas I. Abdulselam

(57) ABSTRACT

An apparatus for controlling the position of a screen pointer for an electronic device having a display screen includes a plurality of sensing elements against which a portion of the tip of a human digit may be placed. A controller coupled to each of the sensing elements senses an electrical property at each of the sensing elements. The controller is configured to generate pixel values representing the portion of the tip of the digit placed against the sensing elements based on the sensed electrical property at each of the sensing elements, and generate movement data based on a comparison of successively generated sets of the pixel values. The comparison includes comparing a first one of the sets with at least one pixel shifted version of a second one of the sets. The movement data is indicative of motion of the tip of the digit across the sensing elements.

35 Claims, 3 Drawing Sheets

IMPEDANCE SENSING SCREEN POINTING DEVICE

REFERENCE TO RELATED PATENTS

This Application is related to the subject matter described in the following U.S. patents: U.S. Pat. No. 5,578,813, filed Mar. 2, 1995, issued Nov. 26, 1996, and entitled FREEHAND IMAGE SCANNING DEVICE WHICH COMPENSATES FOR NON-LINEAR MOVEMENT; U.S. Pat. No. 5,644,139, filed Aug. 14, 1996, issued Jul. 1, 1997, and entitled NAVIGATION TECHNIQUE FOR DETECTING MOVEMENT OF NAVIGATION SENSORS RELATIVE TO AN OBJECT; and U.S. Pat. No. 5,786,804, filed Oct. 6, 1995, issued Jul. 28, 1998, and entitled METHOD AND SYSTEM FOR TRACKING ATTITUDE. These three patents describe techniques of tracking position movement and computer pointing devices. Those techniques are a component in a preferred embodiment described below. Accordingly, U.S. Pat. Nos. 5,578,813, 5,644,139, and 5,786,804 are hereby incorporated herein by reference. This application is also related to the subject matter described in U.S. Pat. No. 6,057,540, filed Apr. 30, 1998, issued May 2, 2000, and entitled MOUSELESS OPTICAL AND POSITION TRANSLATION TYPE SCREEN POINTER CONTROL FOR A COMPUTER SYSTEM; U.S. Pat. No. 6,151,015, filed Apr. 27, 1998, issued Nov. 21, 2000, and entitled PEN LIKE COMPUTER POINTING DEVICE; and U.S. patent application Ser. No. 09/052,046, filed Mar. 30, 1998, entitled SEEING EYE MOUSE FOR A COMPUTER SYSTEM. These two related patents and patent application describe screen pointing devices based on the techniques described in U.S. Pat. Nos. 5,578,813, 5,644,139, and 5,786,804. Therefore, U.S. Pat. Nos. 6,057,540 and 6,151,015, and U.S. patent application Ser. No. 09/052,046, filed Mar. 30, 1998, entitled SEEING EYE MOUSE FOR A COMPUTER SYSTEM, are hereby incorporated herein by reference.

THE FIELD OF THE INVENTION

This invention relates generally to devices for controlling a cursor on a display screen, also known as pointing devices. This invention relates more particularly to an impedance sensing screen pointing device.

BACKGROUND OF THE INVENTION

The use of a hand operated pointing device for use with a computer and its display has become almost universal. By far the most popular of the various devices is the conventional (mechanical) mouse, used in conjunction with a cooperating mouse pad. Centrally located within the bottom surface of the mouse is a hole through which a portion of the underside of a rubber-surfaced steel ball extends. The mouse pad is typically a closed cell foam rubber pad covered with a suitable fabric. Low friction pads on the bottom surface of the mouse slide easily over the fabric, but the rubber ball does not skid. Rather, the rubber ball rolls over the fabric as the mouse is moved. Interior to the mouse are rollers, or wheels, that contact the ball at its equator and convert its rotation into electrical signals representing orthogonal components of mouse motion. These electrical signals are coupled to a computer, where software responds to the signals to change by a ΔX and a ΔY the displayed position of a pointer (cursor) in accordance with movement of the mouse. The user moves the mouse as necessary to get the displayed pointer to a desired location or position. Once the pointer on the screen points at an object or location of interest, a button on the mouse is activated with the fingers of the hand holding the mouse. The activation serves as an instruction to take some action, the nature of which is defined by software in the computer.

A "track ball" is another example of a mechanical type of pointing device. A track ball is essentially an upside-down mouse. In a track ball, rather than sliding the device itself over a surface to produce pointer movement as in a mouse, a user directly contacts the mechanical ball with the user's finger, and causes the ball to rotate. As with a mouse, the movement of the mechanical ball in a track ball generates a corresponding movement of the displayed pointer.

Conventional mechanical pointing devices, such as those described above, have a number of shortcomings. Among the shortcomings are deterioration of the mouse ball or damage to its surface, deterioration or damage to the surface of the mouse pad, and degradation of the ease of rotation of the contact rollers because of accumulation of dirt or lint, and because of wear. These problems can contribute to erratic operation or total failure of the mouse.

In addition to mechanical types of pointing devices like a conventional mouse, optical pointing devices have also been developed, such as those described in the incorporated patents and patent application. In one form of an optical pointing device, rather than using a moving mechanical element like a ball in a conventional mouse, relative movement between an imaging surface, such as a finger or a desktop, and photo detectors within the optical pointing device, is optically sensed and converted into movement information. Optical pointing devices typically use a light source, such as an LED, to illuminate an imaging surface. Optical pointing devices also typically use lenses for focusing images, which requires a certain amount of depth or thickness of the pointing device.

It would be desirable to provide a screen pointing device that is non-mechanical in operation, that is more compact than conventional pointing devices, and that does not use a light source for illuminating an imaging surface, thereby allowing lower power to be used.

SUMMARY OF THE INVENTION

One form of the present invention provides an apparatus for controlling the position of a screen pointer for an electronic device having a display screen. The apparatus includes a plurality of sensing elements against which a portion of the tip of a human digit may be placed. A controller coupled to each of the sensing elements senses an electrical property at each of the sensing elements. The controller is configured to generate pixel values representing the portion of the tip of the digit placed against the sensing elements based on the sensed electrical property at each of the sensing elements. The controller is configured to generate movement data based on a comparison of successively generated sets of the pixel values. The comparison includes comparing a first one of the sets with at least one pixel shifted version of a second one of the sets. The movement data is indicative of motion of the tip of the digit across the sensing elements.

Another form of the present invention provides a method of controlling the position of a screen pointer for an electronic device having a screen display. A portion of an appendage of the human hand is placed against a plurality of sensing elements. An impedance is sensed at each of the sensing elements. Digital values representing the sensed impedance at each of the sensing elements are generated.

The digital values represent digital images of the portion of the appendage placed against the sensing elements. At least one version of a first one of the digital images is correlated with at least one version of a second one of the digital images to generate motion data indicative of motion across the sensing elements by the appendage. The position of the screen pointer is adjusted in accordance with the motion data.

DESCRIPTION OF THE PREFERRED EMBODIMENTS

In the following detailed description of the preferred embodiments, reference is made to the accompanying drawings, which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
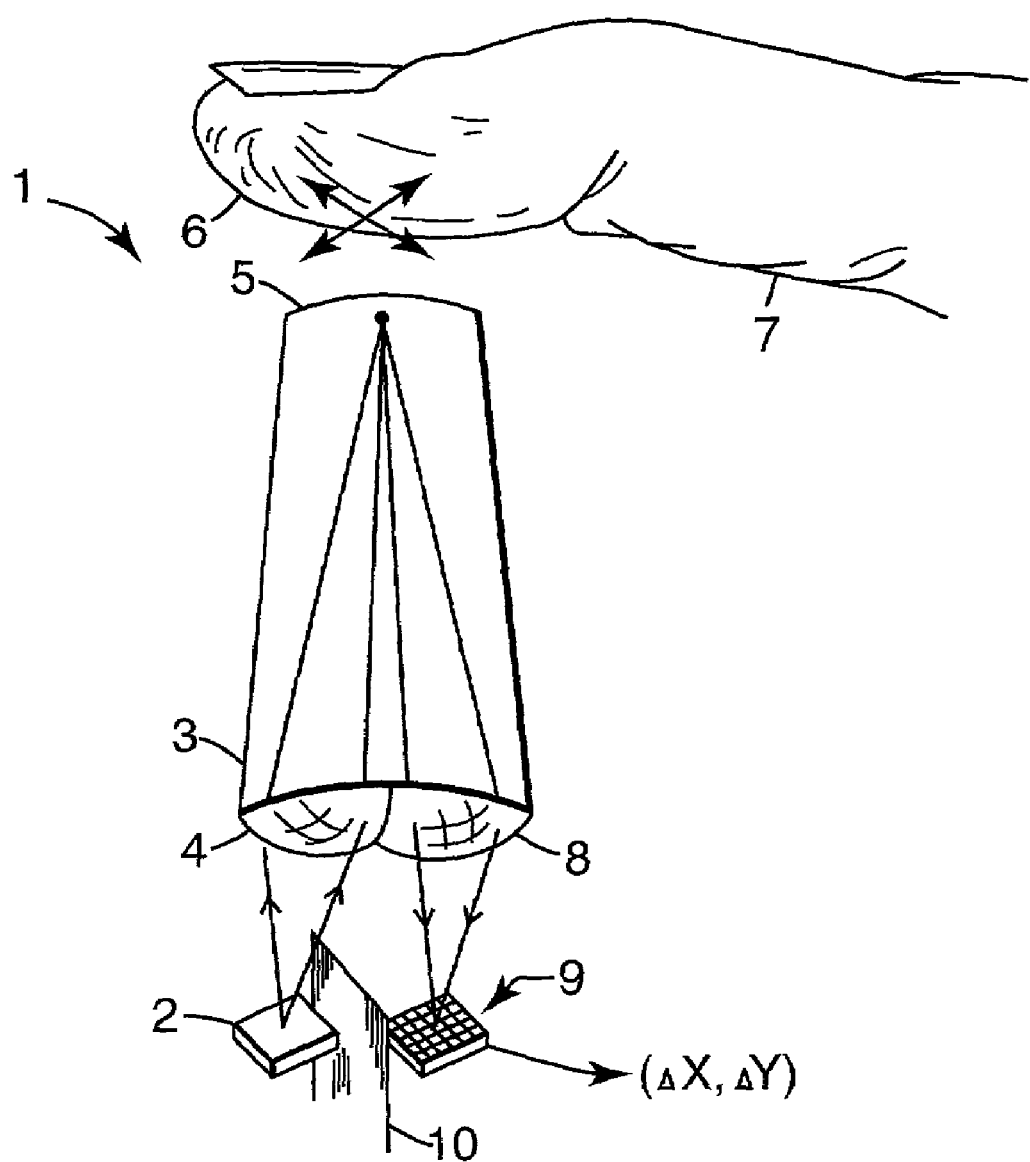
FIG. 1 is a pictographic side view of the main components of a prior art optical, motion translation type screen pointer device.

FIG. 1 shows a simplified representation of a side view of a prior art motion detection arrangement 1 suitable for tracking the movement of a human finger 7 pressed against a surface 5 of a transparent stud 3. A motion detection arrangement like that shown in FIG. 1 is described in detail in the above-incorporated U.S. Pat. No. 6,057,540 (the '540 patent). The operation of motion detection arrangement 1 is also summarized below.

When the tip 6 of finger 7 is pressed against surface 5, the ridges of skin and any other micro texture features are visible in the plane of surface 5, just as if they were a part of surface 5. Lens 8 focuses light from those features onto an array of photo detectors, which is part of movement sensor 9. Movement sensor 9 automatically acquires and tracks any suitable image. When tracking an image, movement sensor 9 produces incremental (X, Y) signals.

Lifting fingertip 6 away from surface 5 produces a loss of tracking. This condition is detected within motion detector 9, and in one embodiment, the production of incremental (X, Y) signals ceases. This has the effect of leaving the position of the screen pointer unchanged at whatever location it currently occupies, and is exactly the same as when a user of a mouse removes his hand from the mouse. When fingertip 6 is subsequently replaced on surface 5, motion detector 9 appreciates that an image has been acquired, and, in one embodiment, treats that acquisition as though a reset has been performed. That is, until there has been new motion subsequent to the new acquisition, the incremental coordinates (X, Y) will have the value (0, 0). This leaves the existing position of the screen pointer undisturbed until such time as it is deliberately moved by the motion of fingertip 6, and corresponds exactly to a mouse user's placement of his hand back on the mouse without moving it.

An LED 2, which is an IR LED in one embodiment, emits light that is projected by lens 4 onto a region 5 that is part of a work surface 6 to be imaged for navigation. In one embodiment, motion sensor 9 is an integrated circuit (IC) having an array of photo detectors, memory, and arithmetic circuits arranged to implement image correlation and tracking functions described herein and in the incorporated patents. An image of the illuminated region 6 is projected through an optical window (which may be transparent stud 3 itself) to a package (not shown) of integrated circuit 9 and onto the array of photo detectors. Lens 8 aids in the projection of the image onto the photo detectors.

One preferred optical navigation technique used by motion detection arrangement 1 involves optically detecting motion by directly imaging as an array of pixels the various particular optical features visible at surface 5, much as human vision is believed to do. IR light reflected from a textured work surface pressed against surface 5 is focused onto a suitable array (e.g., 16×16 or 24×24) of photo detectors. The responses of the individual photo detectors are digitized to a suitable resolution (e.g., six or eight bits) and stored as a frame into corresponding locations within an array of memory. In one embodiment, each pixel in a frame corresponds to one of the photo detectors.

The overall size of the array of photo detectors is preferably large enough to receive an image having several features (e.g., ridges in the whorls of skin). In this way, images of such spatial features produce translated patterns of pixel information as fingertip 6 moves. The number of photo detectors in the array and the frame rate at which their contents are digitized and captured cooperate to influence how fast fingertip 6 can be moved over surface 5 and still be tracked. Tracking is accomplished by comparing a newly captured sample frame with a previously captured reference frame to ascertain the direction and amount of movement.

Figure 2:
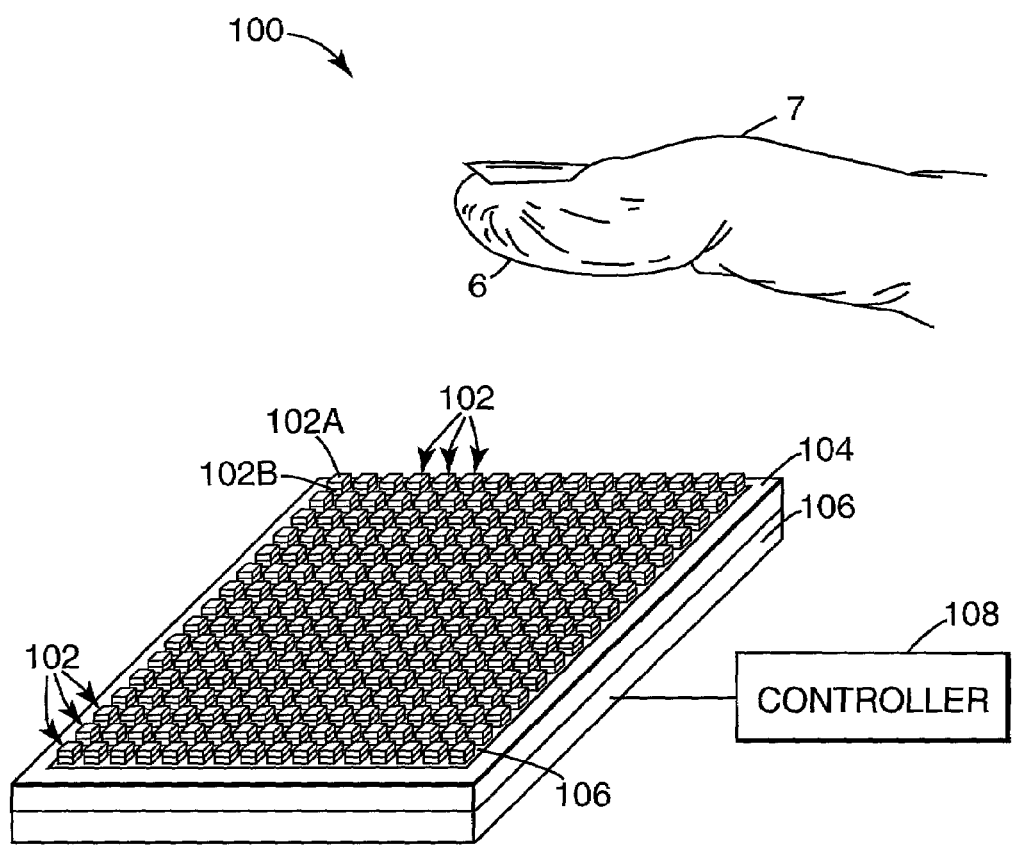
FIG. 2 is a perspective view of one embodiment of a screen pointing device according to the present invention.

FIG. 2 is a perspective view of one embodiment of a screen pointing device according to the present invention. As can be seen in FIG. 2, screen pointing device 100 is more compact than the arrangement 1 shown in FIG. 1. Screen pointing device 100 is not shown actual size in FIG. 2, but rather it is substantially enlarged to better illustrate components of the device. Screen pointing device 100 includes an array of sensing elements 102, guard layer 104, substrate 106, and controller 108. In one embodiment, screen pointing device 100 is integrated into a single chip. Sensing elements 102 are formed on substrate 106. In one embodiment, sensing elements 102 are configured in a 16×16 array, with the array being about 1.5 millimeters by 1.5 millimeters. Other configurations may be used in alternative embodiments, including a 24×24 or other size array. In one embodiment, the pitch of sensing elements 102 ranges between 25 and 250 microns. In another form of the invention, the pitch of sensing elements ranges between 10 and 1000 microns.

In one form of the invention, each sensing element 102 includes a conductive layer 102B formed on substrate 106, and a protective layer 1 02A formed over the conductive layer 102B. In an alternative embodiment, protective layer 102A is a single protective layer sheet covering all conductive layers 102B. Conductive layer 102B is a metal, and protective layer 102A is an insulator, in one embodiment. Guard layer 104 is formed on substrate 106 around the array of sensing elements 102. Controller 108 is coupled to each sensing element 102, and to guard layer 104. In one embodiment, conductive traces are provided in substrate 106 to couple controller 108 to sensing elements 102 and guard layer 104.

Like the prior art motion detection arrangement shown in FIG. 1, screen pointing device 100 also essentially acquires "images" of a fingertip 6, and uses the images to detect movement of fingertip 6 across sensing elements 102. However, rather than using optical techniques to illuminate fingertip 6 and generating images based on reflected light, screen pointing device 100 directly generates images or digital representations of fingertip 6 based on sensed electrical properties at sensing elements 102, as described in further detail below. Controller 108 produces incremental (X, Y) signals indicative of movement of fingertip 6 across sensing elements 102. The incremental (X, Y) signals may be used by a computer or other electronic device to move a screen pointer on a display screen.

In one embodiment, after images have been captured, controller 108 uses exactly or substantially the same technique as the imaging and navigation arrangement described in the incorporated Patents to correlate the images and determine movement of fingertip 6 across sensing elements 102. In addition to being described in the incorporated patents, one embodiment of a technique for correlating images and determining movement information is also summarized below.

To capture an image of fingertip 6 in one form of the present invention, controller 108 measures the capacitance to ground of each conductive layer 102B when fingertip 6 contacts sensing elements 102. The capacitance measurement varies for each sensing element 102 based upon the characteristics of the portion of fingertip 6 that contacts the sensing element 102. The surface of a finger tip 6 includes a plurality of humps and valleys that form whorls. When a valley is positioned over a sensing element 102, a different capacitance measurement is obtained than when a hump is positioned over a sensing element 102. The capacitance will be greater when a hump of a whorl is positioned over a sensing element 102 than when a valley of a whorl is positioned over the sensing element 102.

Those of ordinary skill in the art are aware of various techniques for measuring capacitance. In one form of the invention, capacitance to ground of a sensing element 102 is measured by controller 108 by driving fingertip 6 with an alternating current (AC) signal, and sensing the charge accumulated on each sensing element 102. In one embodiment, guard layer 104 is coupled to the AC signal, and the AC signal is passed on to fingertip 6 when fingertip 6 contacts guard layer 104. In one embodiment, in addition to, or as an alternative to, sensing capacitance at sensing elements 102, another electrical property or impedance is sensed and used to generate values representing portions of fingertip 6.

Figure 3:
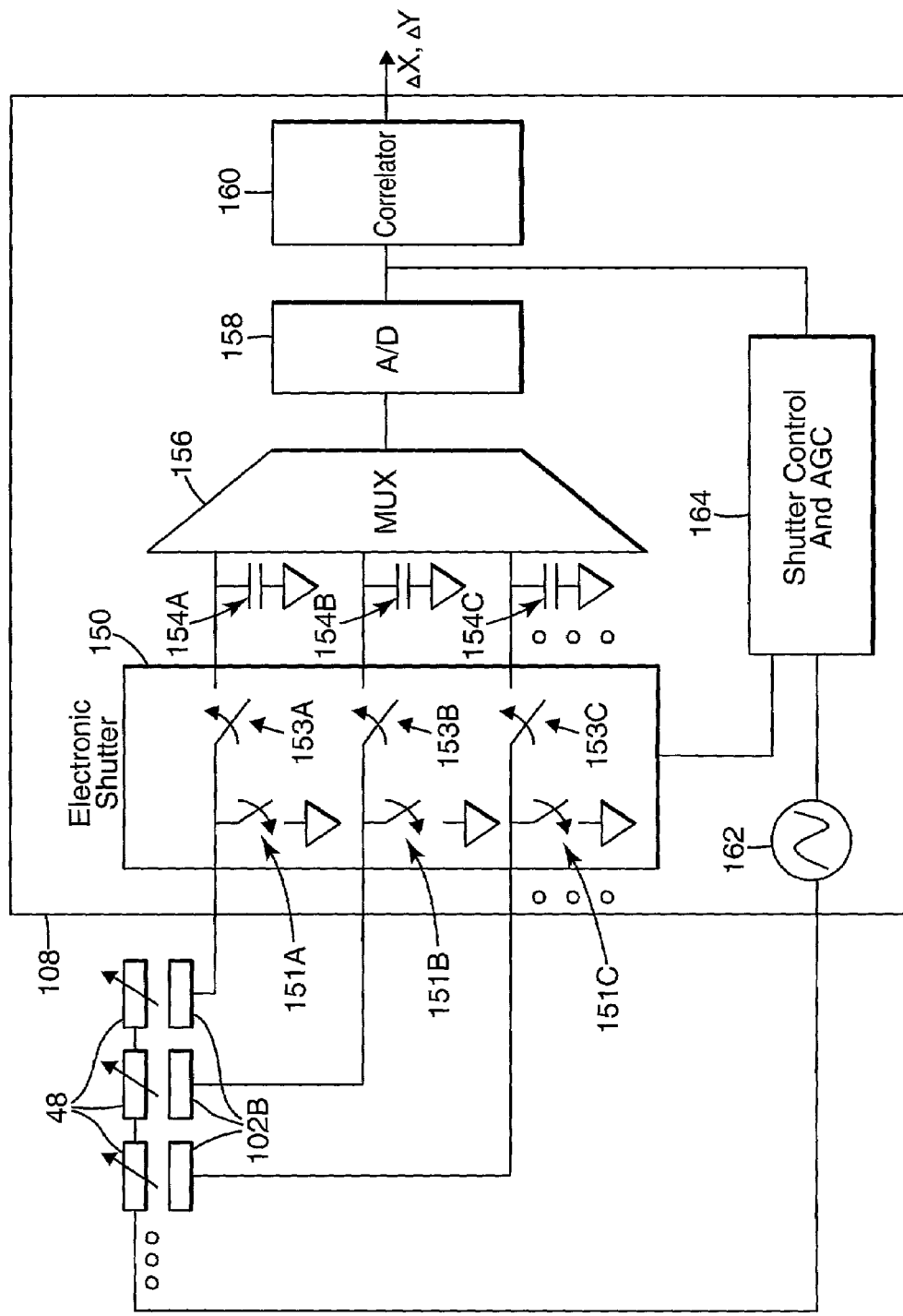
FIG. 3 is an electrical block diagram illustrating major components of one embodiment of a screen pointing device according to the present invention.

FIG. 3 shows an electrical block diagram illustrating major components of controller 108. Controller 108 includes electronic shutter 150 having a first plurality of switches 151A–151C (collectively referred to as switches 151) and a second plurality of switches 153A–153C (collectively referred to as switches 153). Switches 151 are operated independently of switches 153. Controller 108 also includes a plurality of sense capacitors 154A–154C (collectively referred to as sense capacitors 154), multiplexer 156, analog to digital (A/D) converter 158, correlator 160, AC signal generator 162, and shutter control and automatic gain controller (AGC) 164.

In operation, according to one embodiment, AC signal generator 162 drives guard layer 104, and correspondingly fingertip 6, with an AC signal. Fingertip 6 essentially includes a plurality of variable capacitive elements. The portion of fingertip 6 above each sensing element 102 acts as a variable capacitive element. In FIG. 3, fingertip 6 is represented by a plurality of variable capacitive elements 148. To simplify the illustration and explanation, only three variable capacitive elements 148 and three conductive layers 102B are shown in FIG. 3, although the actual number will depend upon the number of sensing elements 102 used. When shutter switches 151 are open and shutter switches 153 are closed, sense capacitors 154 and the variable capacitors created between fingertip 6 and conductive layers 102B form a capacitive potential divider. The charge that accumulates on sense capacitors 154 creates a voltage that is related to the size of the capacitances formed between the fingertip 6 and each conductive layer 102B. When shutter switches 153 are opened, no further charge accumulates or is lost from sense capacitors 154. After shutter switches 153 are opened, conductive layers 102B are coupled to ground by closing switches 151 to discharge conductive layers 102B. Multiplexer 156 connects each sense capacitor 154 in turn to A/D converter 158, to convert the voltage on each sense capacitor 154 into a digital value. Sense capacitors 154 are then coupled to ground by closing switches 151 and 153 to discharge sense capacitors 154. Switches 151 are then opened and switches 153 are closed so that the charging process can be repeated.

Based on the level of capacitance of each sensing element 102, which is temporarily stored in sense capacitors 154, A/D converter 158 generates a digital value of a suitable resolution (e.g., one to eight bits) indicative of the level of capacitance. The digital values for the 16×16 array of sensing elements 102 represent a digital image or digital representation of the portion of fingertip 6 positioned over the array of sensing elements 102. The digital values for the 16×16 array of sensing elements 102 are stored as a frame into corresponding locations within an array of memory within correlator 160. In one embodiment, each pixel in a frame corresponds to one of the sensing elements 102.

The overall size of the array of sensing elements 102 is preferably large enough to receive an image having several features (e.g., ridges in the whorls of skin). In this way, images of such spatial features produce translated patterns of pixel information as fingertip 6 moves. The number of sensing elements 102 in the array and the frame rate at which their contents are digitized and captured cooperate to influence how fast fingertip 6 can be moved across sensing elements 102 and still be tracked. Tracking is accomplished by correlator 160 by comparing a newly captured sample frame with a previously captured reference frame to ascertain the direction and amount of movement.

In one embodiment, the entire content of one of the frames is shifted by correlator 160 by a distance of one pixel successively in each of the eight directions allowed by a one pixel offset trial shift (one over, one over and one down, one down, one up, one up and one over, one over in the other direction, etc.). That adds up to eight trials. Also, since there might not have been any motion, a ninth trial "null shift" is also used. After each trial shift, those portions of the frames that overlap each other are subtracted by correlator 160 on a pixel by pixel basis, and the resulting differences are preferably squared and then summed to form a measure of similarity (correlation) within that region of overlap. Larger trial shifts are possible, of course (e.g., two over and one down), but at some point the attendant complexity ruins the advantage, and it is preferable to simply have a sufficiently high frame rate with small trial shifts. The trial shift with the least difference (greatest correlation) can be taken as an indication of the motion between the two frames. That is, it provides raw movement information that may be scaled and or accumulated to provide display pointer movement information ($\Delta X$ and $\Delta Y$) of a convenient granularity and at a suitable rate of information exchange. In one embodiment, analog to digital conversion is not performed, and correlation is performed on analog data.

Correlator 160 automatically detects when fingertip 6 has been removed from sensing elements 102, by sensing that all or a majority of the pixels in the image have become essentially uniform. When fingertip 6 is not in contact with the array of sensing elements 102, the capacitance to ground of each sensing element 102 will be close to the same value, which results in near uniform pixel values.

In addition to providing digital images to correlator 160, A/D converter 158 also outputs digital images to shutter control and automatic gain controller 164. Shutter control and automatic gain controller 164 helps to ensure that successive images have a similar exposure, and helps to prevent the digital values from becoming saturated to one value. Controller 164 checks the values of digital images and determines whether there are too many minimum values or too many maximum values. If there are too many minimum values, controller 164 either increases the output of AC signal generator 162, or increases the charge accumulation time of electronic shutter 150, or increases both. If there are too many maximum values, controller 164 either decreases the output of AC signal generator 162, or decreases the charge accumulation time of electronic shutter 150, or decreases both.

In operation, images should be acquired at a rate sufficient that successive images differ in distance by no more that perhaps a quarter of the width of the array, or 4 pixels for a 16×16 array of sensing elements 102. Experiments show that a finger speed of 50 mm/sec is not unreasonable, which corresponds to a speed at the array of 800 pixels per second. To meet a requirement of not moving more than four pixels per cycle, a measurement rate of 200 samples per second is needed. This rate is quite practical, and it may be desirable to operate at several times this rate.

In one form of the invention, rather than driving guard layer 104 and fingertip 6 with an AC signal from AC signal generator 162, fingertip 6 is driven by signals picked up from the surrounding air. The body acts as antenna and receives signals from the air, such as from nearby transmission lines. In this embodiment, guard layer 104 need not be present, or may be present but is not driven by AC signal generator 162. In one form of the invention, if fingertip 6 is driven by signals from the surrounding air, shutter control and automatic gain controller 164 operates synchronously with the signal, and controls electronic shutter 150 to provide an appropriate charge accumulation time for the signal.

It will be understood by a person of ordinary skill in the art that functions performed by controller 108 may be implemented in hardware, software, firmware, or any combination thereof. The implementation may be via a microprocessor, programmable logic device, or state machine. Components of the present invention may reside in software on one or more computer-readable mediums. The term computer-readable medium as used herein is defined to include any kind of memory, volatile or non-volatile, such as floppy disks, hard disks, CD-ROMs, flash memory, read-only memory (ROM), and random access memory.

Embodiments of the present invention provide numerous benefits, including the use of low power, since no light source is needed to generate images, and a compact size, since optical elements such as lenses, which contribute to the depth of an optical screen pointing device, are not needed to focus generated images. Because of the lower power requirements and compact nature, one form of the present invention is ideally suited for portable electronic devices such as cellular telephones, personal digital assistants (PDAs), portable music players (e.g., MP3 players), pagers, portable game devices, and other portable devices. In addition, embodiments of the present invention provide additional functionality that is not present in current fingerprint sensor technologies. For example, some fingerprint sensors use capacitive sensing, but they do not track movement of a fingertip and correlate successive images to generate movement information. In addition, embodiments of the sensor of the present invention are over ten times smaller in size and number of pixels than many existing fingerprint sensors (e.g., 1.5 millimeters with 16×16 pixels versus 20 mm and 500×500 pixels).

Although specific embodiments have been illustrated and described herein for purposes of description of the preferred embodiment, it will be appreciated by those of ordinary skill in the art that a wide variety of alternate and/or equivalent implementations may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. An apparatus for controlling the position of a screen pointer for an electronic device having a display screen, the apparatus comprising:
    a plurality of sensing elements against which a portion of the tip of a human digit may be placed; and
    a controller coupled to each of the sensing elements for sensing an electrical property at each of the sensing elements, the controller configured to generate pixel values representing the portion of the tip of the digit placed against die sensing elements based on the sensed electrical property at each of the sensing elements, the controller configured to generate movement data based on a comparison of successively generated sets of the pixel values, the comparison including comparing a first one of the sets with at least one pixel shifted version of a second one of the sets, the movement data indicative of motion of the tip of the digit across the sensing elements.

2. The apparatus of claim 1, wherein the values are digital values.

3. The apparatus of claim 1, wherein the electrical property is impedance.

4. The apparatus of claim 1, wherein the electrical property is capacitance.

5. The apparatus of claim 4, wherein the controller further comprises an electronic shutter coupled to the plurality of sensing elements for controlling a charge accumulation time of the sensing elements.

6. The apparatus of claim 1, wherein each sensing element includes a conductive layer.

7. The apparatus of claim 6, wherein each conductive layer is a metal.

8. The apparatus of claim 6, wherein each sensing element further includes a protective layer formed over the conductive layer.

9. The apparatus of claim 8, wherein each protective layer is an insulator.

10. The apparatus of claim 1, and further comprising a protective layer formed over the plurality of sensing elements.

11. The apparatus of claim 1, and further comprising a substrate, the plurality of sensing elements formed on the substrate.

12. The apparatus of claim 1, and further comprising a conductive rim formed around a perimeter of the plurality of sensing elements.

13. The apparatus of claim 12, wherein the controller further comprises an alternating current signal source coupled to the conductive rim for driving the conductive rim with an alternating current signal.

14. The apparatus of claim 13, wherein the controller further comprises an automatic gain controller coupled to the alternating current signal source for controlling the magnitude of the alternating current signal.

15. The apparatus of claim 1, wherein the plurality of sensing elements are organized into a square array with a plurality of rows of sensing elements and a plurality of columns of sensing elements.

16. The apparatus of claim 15, wherein the number of rows and columns of sensing elements ranges between about 15 and 25.

17. The apparatus of claim 16, wherein the pitch of the plurality of sensing elements ranges between about 10 to 1000 microns.

18. The apparatus of claim 16, wherein the pitch of the plurality of sensing elements ranges between about 25 to 250 microns.

19. The apparatus of claim 1, wherein the plurality of sensing elements are organized into an array with a plurality of rows of sensing elements and a plurality of columns of sensing elements, and wherein the array is less than about 2 millimeters by 2 millimeters.

20. The apparatus of claim 1, wherein the plurality of sensing elements are organized into an array with a plurality of rows of sensing elements and a plurality of columns of sensing elements, and wherein the array is a substantially square array with dimensions of about 1.5 millimeters by 1.5 millimeters.

21. A method of controlling the position of a screen pointer for an electronic device having a screen display, the method comprising:
   placing a portion of an appendage of the human hand against a plurality of sensing elements;
   sensing an impedance at each of the sensing elements;
   generating digital values representing the sensed impedance at each of the sensing elements, the digital values representing digital images of the portion of the appendage placed against the sensing elements;
   correlating at least one version of a first one of the digital images with at least one version of a second one of the digital images to generate motion data indicative of motion across the sensing elements by the appendage; and
   adjusting the position of the screen pointer in accordance with the motion data.

22. The method of claim 21, wherein the impedance is capacitance.

23. The method of claim 21, wherein each sensing element includes a conductive layer.

24. The method of claim 23, wherein each conductive layer is a metal.

25. The method of claim 23, wherein each sensing element further includes a protective layer formed over the conductive layer.

26. The method of claim 25, wherein each protective layer is an insulator.

27. The method of claim 21, wherein a protective layer is formed over the plurality of sensing elements.

28. The method of claim 21, wherein the plurality of sensing elements are formed on a substrate.

29. The method of claim 21, wherein a conductive rim is formed around a perimeter of the plurality of sensing elements, the method further comprising:
   driving the conductive rim with an alternating current signal.

30. The method of claim 21, wherein the plurality of sensing elements are organized into a square array with a plurality of rows of sensing elements and a plurality of columns of sensing elements.

31. The method of claim 30, wherein the number of rows and columns of sensing elements ranges between about 15 and 25.

32. The method of claim 21, wherein the pitch of the plurality of sensing elements ranges between about 10 to 1000 microns.

33. The method of claim 21, wherein the pitch of the plurality of sensing elements ranges between about 25 to 250 microns.

34. The method of claim 21, wherein the plurality of sensing elements are organized into an array with a plurality of rows of sensing elements and a plurality of columns of sensing elements, and wherein the array is less than about 2 millimeters by 2 millimeters.

35. The method of claim 21, wherein the plurality of sensing elements are organized into an array with a plurality of rows of sensing elements and a plurality of columns of sensing elements, and wherein the array is a substantially square array with dimensions of about 1.5 millimeters by 1.5 millimeters.

* * * * *

UNITED STATES PATENT AND TRADEMARK OFFICE
CERTIFICATE OF CORRECTION

PATENT NO. : 7,184,026 B2 Page 1 of 1
APPLICATION NO. : 09/812252
DATED : February 27, 2007
INVENTOR(S) : Gary Gordon It is certified that error appears in the above-identified patent and that said Letters Patent is hereby corrected as shown below:

Col. 8, line 42;
In Claim 1, delete "die" and
insert -- the --, therefor.

Col. 9, line 30;
In Claim 18, delete "16." and
insert -- 16, --, therefor.

Col. 9, line 37;
In Claim 19, delete "2millimeters." and
insert -- 2 millimeters. --, therefor.

Signed and Sealed this

Twenty-ninth Day of July, 2008

JON W. DUDAS
*Director of the United States Patent and Trademark Office*